(12) United States Patent
Regnier

(10) Patent No.: US 10,122,106 B2
(45) Date of Patent: *Nov. 6, 2018

(54) CONNECTOR SYSTEM WITH THERMAL SURFACE

(71) Applicant: Molex, LLC, Lisle, IL (US)

(72) Inventor: Kent E. Regnier, Lombard, IL (US)

(73) Assignee: Molex, LLC, Lisle, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/881,985

(22) Filed: Jan. 29, 2018

(65) Prior Publication Data

US 2018/0151970 A1 May 31, 2018

Related U.S. Application Data

(63) Continuation of application No. 14/392,106, filed as application No. PCT/US2014/035304 on Apr. 24, 2014, now Pat. No. 9,882,297.

(60) Provisional application No. 61/815,565, filed on Apr. 24, 2013, provisional application No. 61/913,008, filed on Dec. 6, 2013.

(51) Int. Cl.

| H01R 13/00 | (2006.01) |
| H01R 12/72 | (2011.01) |
| H01R 13/6583 | (2011.01) |
| H01R 13/66 | (2006.01) |
| H01R 24/30 | (2011.01) |
| H01R 43/20 | (2006.01) |
| H05K 7/20 | (2006.01) |
| G02B 6/42 | (2006.01) |

(52) U.S. Cl.
CPC ....... *H01R 12/721* (2013.01); *H01R 13/6583* (2013.01); *H01R 13/6691* (2013.01); *H01R 24/30* (2013.01); *H01R 43/205* (2013.01); *H05K 7/20127* (2013.01); *G02B 6/4269* (2013.01); *H01R 12/724* (2013.01); *H05K 7/20154* (2013.01); *H05K 7/20509* (2013.01)

(58) Field of Classification Search
None
See application file for complete search history.

(56) References Cited

U.S. PATENT DOCUMENTS

| 6,062,893 A | 5/2000 | Miskin et al. |
| 6,811,326 B2 | 11/2004 | Keeble et al. |
| 6,870,746 B2 | 3/2005 | Leeson et al. |
| 7,195,403 B2 | 3/2007 | Oki et al. |
| 7,239,515 B2 | 7/2007 | Bulman-Fleming et al. |
| 7,322,850 B2 | 1/2008 | Neer et al. |
| 7,433,193 B2 | 10/2008 | Santurkar et al. |
| 9,882,297 B2 * | 1/2018 | Regnier ............... H01R 12/721 |
| 2006/0246766 A1 | 11/2006 | Neer et al. |
| 2009/0253290 A1 | 10/2009 | Harris |

(Continued)

FOREIGN PATENT DOCUMENTS

JP 2005-316475 A 11/2005

*Primary Examiner* — Tho D Ta
(74) *Attorney, Agent, or Firm* — Jeffrey K. Jacobs

(57) ABSTRACT

A module can be configured to mate with a receptacle. The module includes a body with a thermal surface that is coupled to thermally active circuitry supported by the body. The receptacle is configured to allow air to flow over the thermal surface so as to dissipate thermal energy from the circuitry.

11 Claims, 13 Drawing Sheets

(56) References Cited

U.S. PATENT DOCUMENTS

2011/0051373 A1 3/2011 McColloch
2012/0052720 A1 3/2012 David et al.

* cited by examiner

CONNECTOR SYSTEM WITH THERMAL SURFACE

RELATED APPLICATIONS

This application claims priority to U.S. application Ser. No. 14/392,106, filed Oct. 26, 2015, now U.S. Pat. No. 9,882,297, which is a national phase of PCT Application No. PCT/US2014/035304, filed Apr. 24, 2014, which in turn claims priority to U.S. Provisional Application No. 61/815,565, filed Apr. 24, 2013 and to U.S. Provisional Application No. 61/913,008, filed Dec. 6, 2013, all of which are incorporated herein by reference in their entirety.

FIELD OF THE INVENTION

The present invention relates to field of connectors, more specifically to the field of connectors suitable for supporting high data rates.

DESCRIPTION OF RELATED ART

Connector systems are often used to connect servers and switch on racks. For certain applications, the servers and switches share the same or adjacent rack and can be coupled with passive cable assemblies. For other applications, the distance between the two devices is too great, thus necessitating active cable assemblies. In the past, for example, passive cable assemblies were often suitable for distances of up to 10 meters, active copper cable assemblies were suitable for distances of up to 100 meters and beyond that it was generally necessary to use an optical based medium to transfer the signals. To make the system more flexible, however, the mating interface of all three cable assemblies (the passive copper, the active copper and the optical) is the same. Thus, the same input/ouput (IO) port can be used and a switch or server can be used in a wide range of applications.

As the frequency of encoding has increased to beyond 5 Ghz, however, it has become more and more challenging to work with copper-based assemblies. It is possible, for example, to reach data rates of up to about 25 Gbps using NRZ encoding but the necessary signal frequency makes it difficult to have cables longer than about five to eight meters long. For higher data rates it becomes increasingly difficult to have sufficient signal to noise ratio, simply because of the attenuation that naturally occurs in copper wires.

As a result of the physical properties of copper, and the lack of a suitable replacement for copper, it is expected that future designs may well aim for a 2 meter passive cable, a 10 meter active copper cable and cable assemblies longer than that will likely be optical based. One significant effect of this is that it is much more likely that active cable assemblies will be used. This is expected to cause significant problems for the servers and switches.

Currently switches and servers are designed to work with input/output (IO) ports that provide 10 Gbps channels (often 1× or 4× or 10×) and future channels are expected to be required to function at 16-25 Gbps. Typically these channels include a one transmit sub-channel and a one receive sub-channel, thus a 10 Gbps 1× channel can receive up to 10 Gbps and can transmit up to 10 Gbps. To meet the requirements of many applications, it is desirable to increase the number of ports in a given space. Thus, a switch that can handle 48 1× ports is more desirable than a switch that can handle 24 1× ports (assuming greater performance is beneficial). Similarly, a switch with 24 1× ports that can operate at 16 Gbps would be more desirable than a switch with 24 1× ports that can only operate at 10 Gbps. As noted above, each of the ports typically can be used with any type of cable assembly (passive copper, active copper or optical).

As can be appreciated, however, increasing the data rate tends to increase the number of active cable assemblies (assuming that a system regularly needs longer cables). Active cable assemblies (e.g., cable assemblies with circuitry that acts as a power consumption device), unlike passive cable assemblies, generate substantial heat energy which must be cooled if the system is to function reliably. This means that the switch manufacture must either design a switch/box that can handle increased thermal loads or the switch manufacture must limit the number of ports that are provided. Thermal loads per module have increased such that it is becoming increasingly difficult to manage the thermal system with air cooled systems. However, water cooled systems add additional complexity and thus there is resistance to designing servers and switches and other such boxes that require the use of a water-cooled system. Accordingly, certain individuals would appreciate further improvements to the design of IO systems suitable for use with high data rates.

BRIEF SUMMARY

A connector system is disclosed that includes a module and a receptacle. The module includes a body with a mating face and a first side. A thermal surface is provided on the first side and the thermal surface is configured to provide increased surface area so as to aid in the dissipation of thermal energy. The thermal surface can include fins so as to provide increased surface area. The receptacle includes a first portion sized to accept the thermal surface and includes a second portion sized smaller than the first portion. The receptacle can include a vent wall. Air can flow in the port, over the thermal surface, and then through the vent wall so as to provide cooling for the module. Air can also flow the opposite direction and cool the module.

BRIEF DESCRIPTION OF THE DRAWINGS

The present invention is illustrated by way of example and not limited in the accompanying figures in which like reference numerals indicate similar elements and in which.

DETAILED DESCRIPTION

Figure 1:
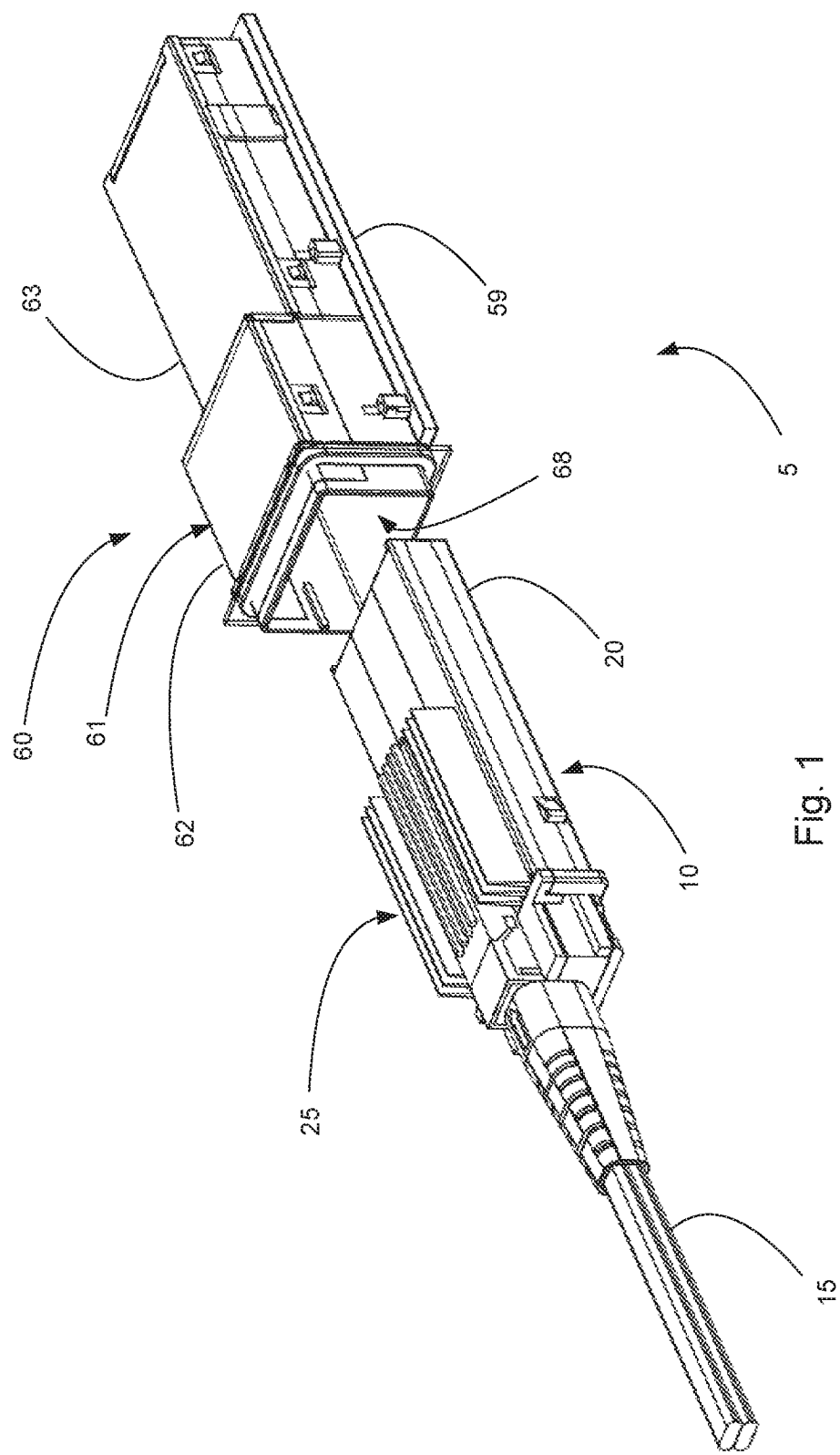
FIG. 1 illustrates a perspective view of an exemplary connector system in an unmated position.
Figure 2:
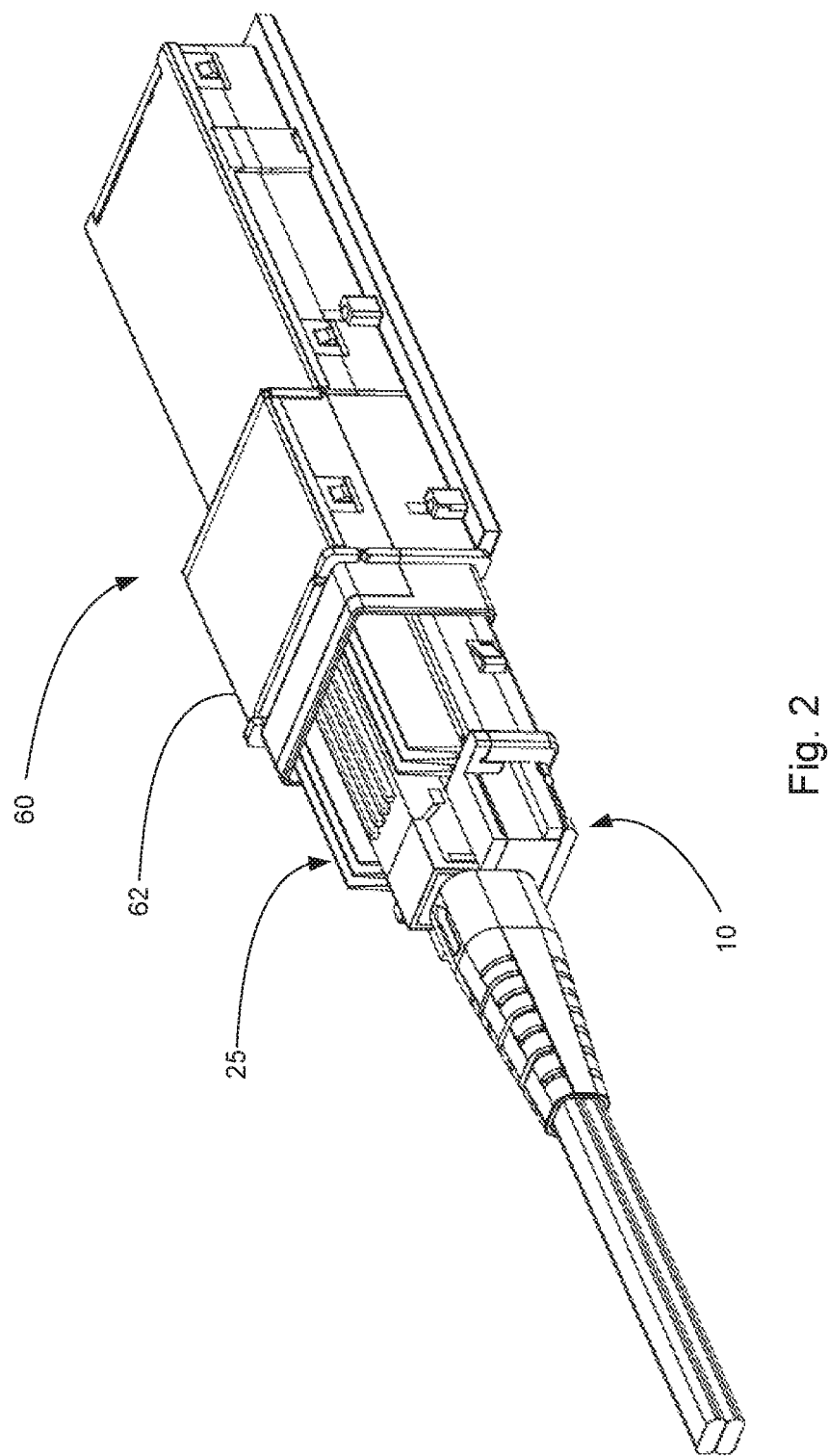
FIG. 2 illustrates a perspective view of the embodiment depicted in FIG. 1 in a partially mated position.
Figure 3:
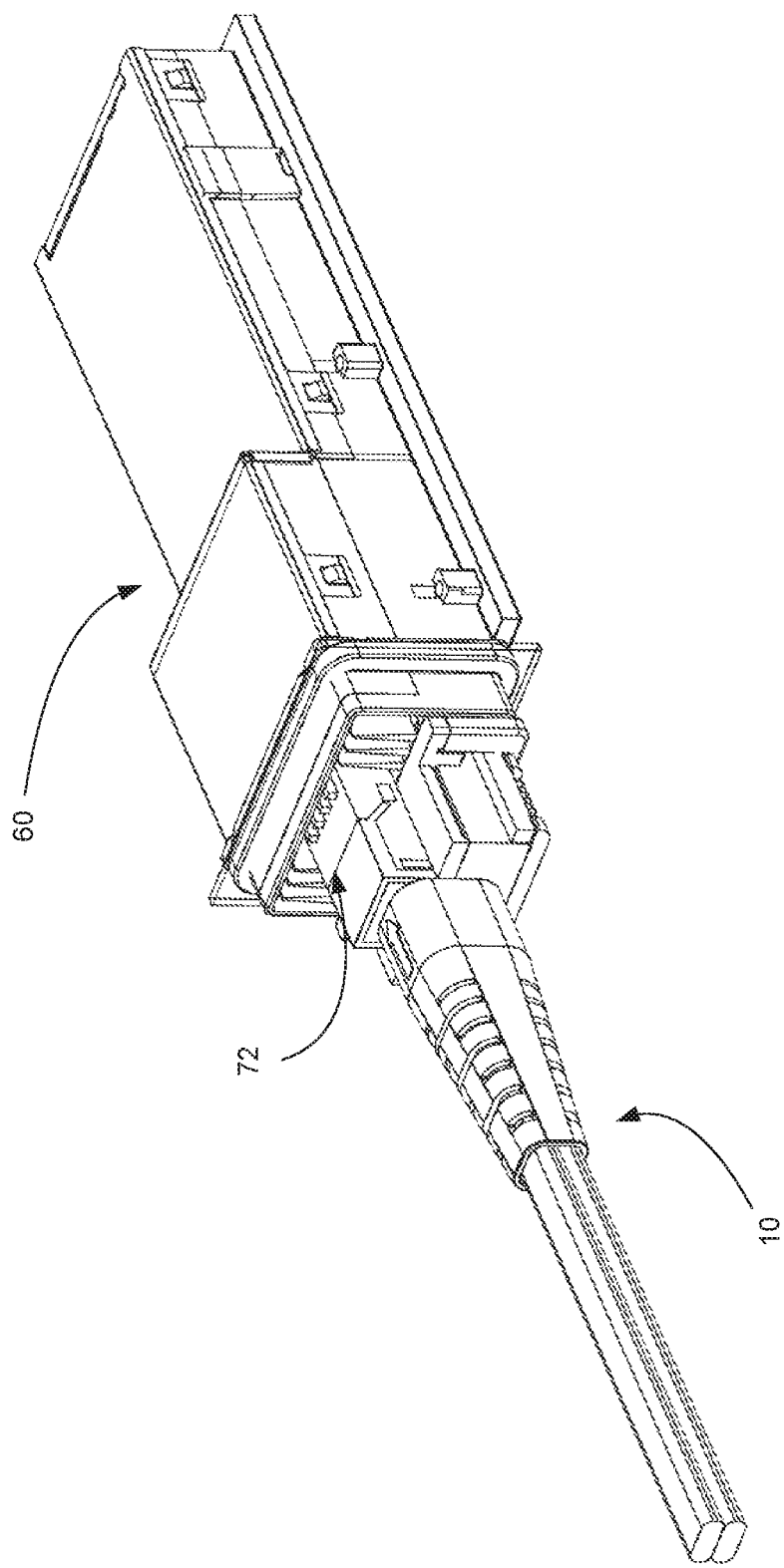
FIG. 3 illustrates a perspective view of the embodiment depicted in FIG. 1 in a mated position.

The detailed description that follows describes exemplary embodiments and is not intended to be limited to the expressly disclosed combination(s). Therefore, unless otherwise noted, features disclosed herein may be combined together to form additional combinations that were not otherwise shown for purposes of brevity.

A connector system is disclosed that include a module 10 and a receptacle 60. As can be appreciated, a connector system works best when the module and receptacle are configured to be compatible with another but the basic design can be used in a number of potential configurations. For example, a module could be configured so as to provide the benefits discussed without having a thermal surface positioned in the cage. In addition, the position of the thermal surface could be adjusted to one side of the module (instead of on the top as depicted). Further variations such as a stacked configuration are also possible. If the thermal surface was provided on the side then the stacked configuration would be straightforward. If the thermal surface is provided on the top surface then it would be beneficial to provide appropriate venting in the receptacle so that air could flow over the top and bottom port.

In the depicted Figs., one feature that can be appreciated is that there is a reduced thermal resistance between a power consumption device and the thermal surface that is used to dissipate thermal energy via air flow. In prior designs, such as riding heat sinks, the terminal resistance between a module and a heat sink tends to be in the range of about 2 C/watt. With spring finger designs the thermal resistance between a module and a heat sink can be reduced to 1 C/watt but even that may be too much for higher powered modules. That is because thermal resistance is serial in nature and thus adds up. Therefore, the 1 C/watt resistance would be added to the thermal resistance between the heat sink and cooling air. If the thermal resistance between the heat sink and cooling air was 1.5 C/watt and spring fingers were used between the module and the heat sink then the temperature rise between the module and the cooling air would be about 2.5 C/watt. With a 10 watt module and a 30 C temperature for the cooling air, the temperature of the module would be about 55 C (assuming no other thermal resistance existed, which is unlikely to be the case). As can be appreciated, such a design might not be desirable as it could potentially affect the useful life of the module. With the depicted design, however, the thermal resistance can be minimized so that the primary thermal resistance would be caused be the thermal junction between cooling air and the thermal surface. This could still be about 1.5 C/watt, for example, but that would lead to a module with a temperature of 45 C if generating 10 watts and using 30 C air for cooling. Naturally, such a reduction in the temperature of the module would be beneficial to improving the reliability of the module and would further allow for the possibility of cooling an application with ambient air (e.g., air that is not otherwise cooled).

It should be noted that the actual thermal resistance between a thermal surface and cooling air is expected to vary significantly based on a number of facts, including but not limited to amount of surface area, profile of the thermal surface, velocity of the cooling air and temperature of the cooling air. Thus, the thermal resistance is expected to vary from design to design. One potential benefit of the depicted embodiments, however, is the elimination of a substantial thermal resistance due to the ability to avoid a transition between a module and a heat sink.

Turning to the Figs., a connector system 5 includes a module 10 that is configured to mate with a receptacle 60. The depicted module 10 includes a body 20, supports cables 15 (which can be optical fibers) and includes a thermal surface 25 that is formed of fins on a first side 20a. As depicted, the body has a height that is a first distance D1 while the thermal surface 25 extends above the first side a distance D2. In an embodiment the distance D2 can be 50% or more of the distance D1. As can be appreciated, the thermal surface 25 is shown with fins but other structures such as a mesh or honeycomb structure could also be used to further increase surface area. It should be noted, however, that at some point further increasing surface area will have diminishing returns as it will start to reduce airflow such that increasing the surface area will reduce the amount of cooling taking place. Preferably the surface area of the thermal surface will be more than 1.5 times a flat surface and more preferably will be at least 2 times a flat surface. If desired, the module and the receptacle can be sized and configured so that in operation the air flow over the thermal surface 25 is turbulent.

The module 10 includes one or more paddle cards 26a, 26b and the paddle cards are connected to or contain circuitry 27 that generate thermal energy do to the circuitry's active nature. As depicted, the thermal surface 25 includes fins that are positioned on two sides of a projection 29. The projection 29 is included because the depicted module is an optical module designed to convert electrical signals to optical signals and includes a projection 29 in the body 20 to improve the connection to the fiber. If this projection 29 was not needed or if the module was being used to provide an active copper cable assembly (which tends to not benefit from the projection) then a profile of the thermal surface could extend across the first side of the module in a more uniform manner.

The module 10 includes an EMI surface 28 that is configured to engage an EMI gasket provided in the receptacle. As can be appreciated, the EMI surface 28 is positioned between the thermal surface 25 and a mating face 21 of the module 10. This allows for EMI sealing between the receptacle 60 and the module 10 while still allowing air to flow over the thermal surface 25. It should be noted that while the EMI surface is depicted as being substantially flat so as to allow for easy engagement with an EMI gasket provided by the receptacle, the EMI surface could support an EMI gasket that engages a surface on the receptacle (thus the EMI gasket could be positioned on the module or the receptacle or some combination of both, as desired). In addition, the EMI surface does not need to be flat. As the openings in the vent wall may be too large to provide the desired EMI performance, the EMI gasket can be positioned in the port between the vent wall and housing that (e.g., the EMI gasket can be provided in the portion of the port that has a smaller perimeter).

The receptacle 60 includes a cage 61 with a front portion 62 and a rear portion 63 and the cage is positioned around a housing 90 and the cage can be mounted on a circuit board 59. The housing 90 supports terminals 96 with contacts that can be positioned on two sides 91a, 91b of a card slot 91 and in an embodiment the terminals can be supported by wafers 92 (as is known in the art). The front portion 62 is sized to allow the thermal surface 25 to be inserted into the receptacle 60 while the rear portion 63 is smaller, which can help provide alignment functionality so as to ensure the paddle card(s) supported by the body 20 are appropriately aligned with the housing 90. In other words, the front portion 62 has an internal perimeter that is a first size and the rear portion 63 has an internal perimeter that is a second size, the second size being smaller than the first size.

The front portion 62 includes a top wall 64a and a vent wall 65 with a set of apertures 67 while the rear portion 63 includes a top wall 64b and a rear wall 64c. The housing 90 positioned in the rear portion 63 can include one or more card slots 91 (the number of card slots being configured to match the number of paddle cards). The receptacle 60 includes a front edge 71 that defines a port 68 and the port 68 provides a port inlet 72 and a module inlet 72a, the module inlet 72a having a smaller internal perimeter than the port inlet 72. To provide for orientation of an inserted module, the cage 61 can include an alignment member 74 that helps ensure an inserted module is properly positioned early in the insertion process so that the paddle cards 26a (26b) can engage the card slots 91 in a front face 94 of the housing 90.

The depicted receptacle 60 includes an EMI gasket 77 that includes fingers 78. The fingers 78 engage the EMI surface 28 of the module 10 and help provide an EMI barrier between a front face 94 of housing 90 and the port inlet 72. As noted above, the EMI barrier can be positioned between the front face 94 and the front edge 71 but it is expected that, due to the desire to have the thermal surface 25 with more surface area, the thermal surface will be less ideally suited to engaging an EMI gasket and thus it will typically make sense to position the EMI barrier between the thermal surface 25 and the front face 94.

Figure 8:
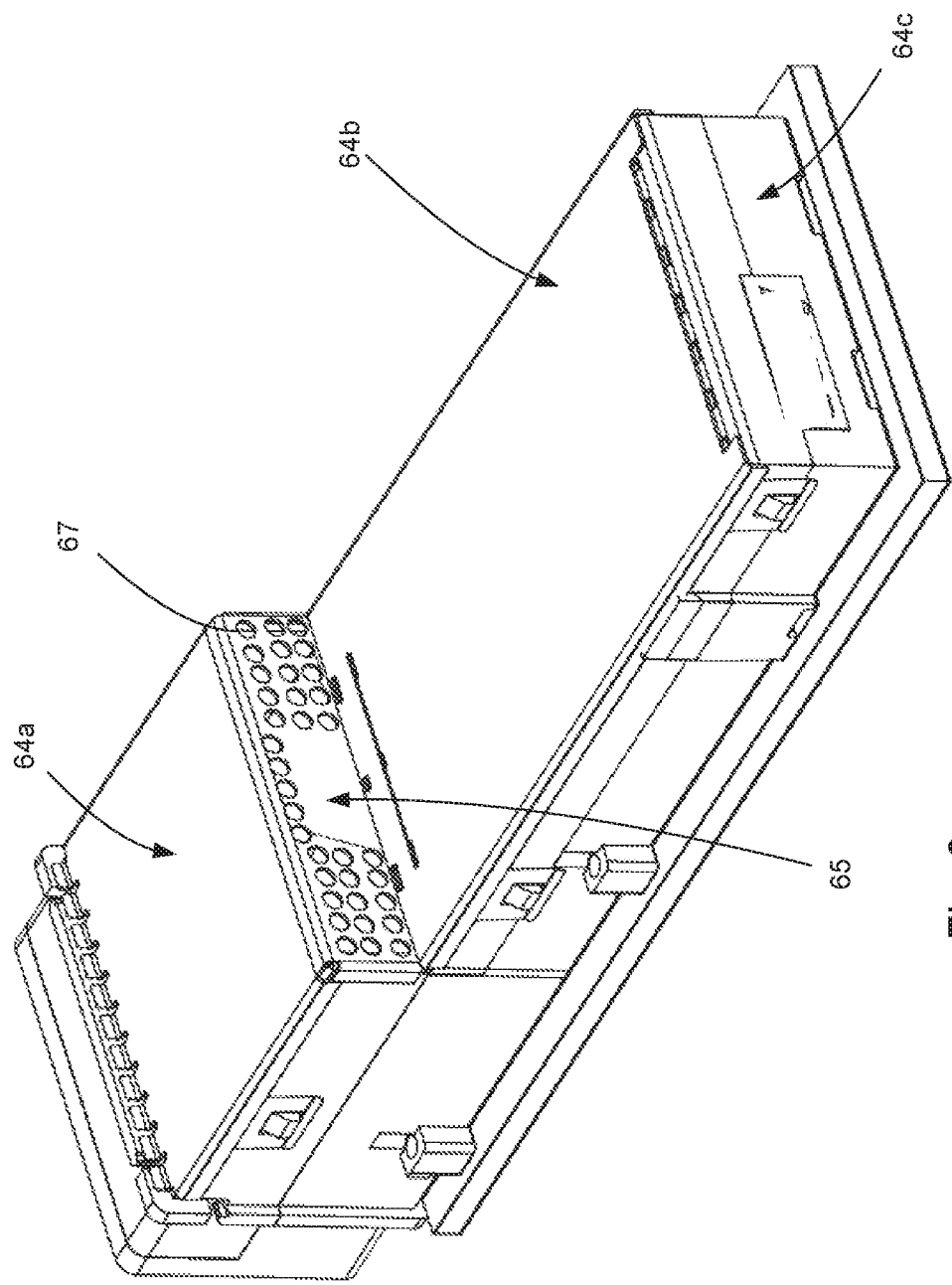
FIG. 8 illustrates another perspective view of the receptacle depicted in FIG. 6.
Figure 9:
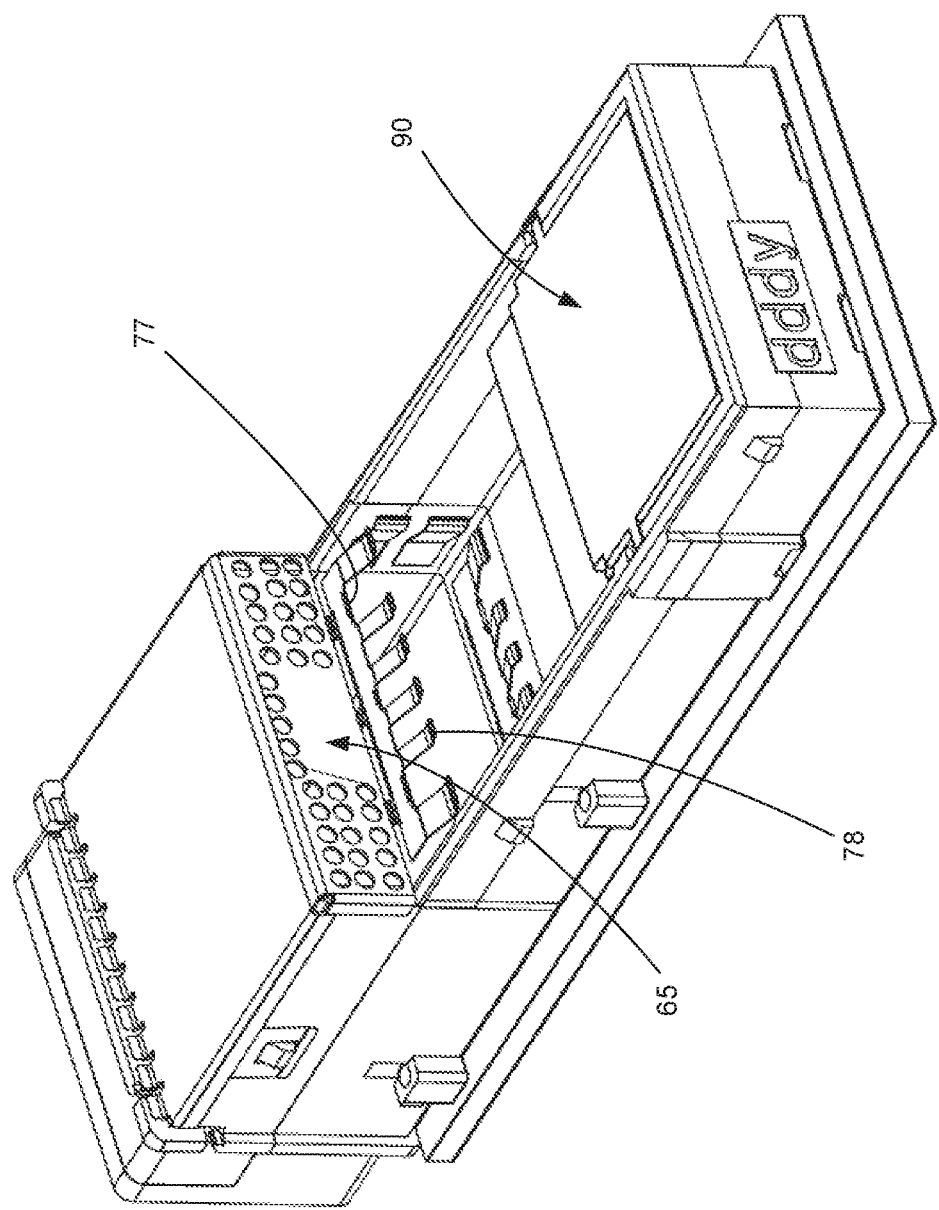
FIG. 9 illustrates a perspective partial view of the embodiment depicted in FIG. 8.
Figure 10:
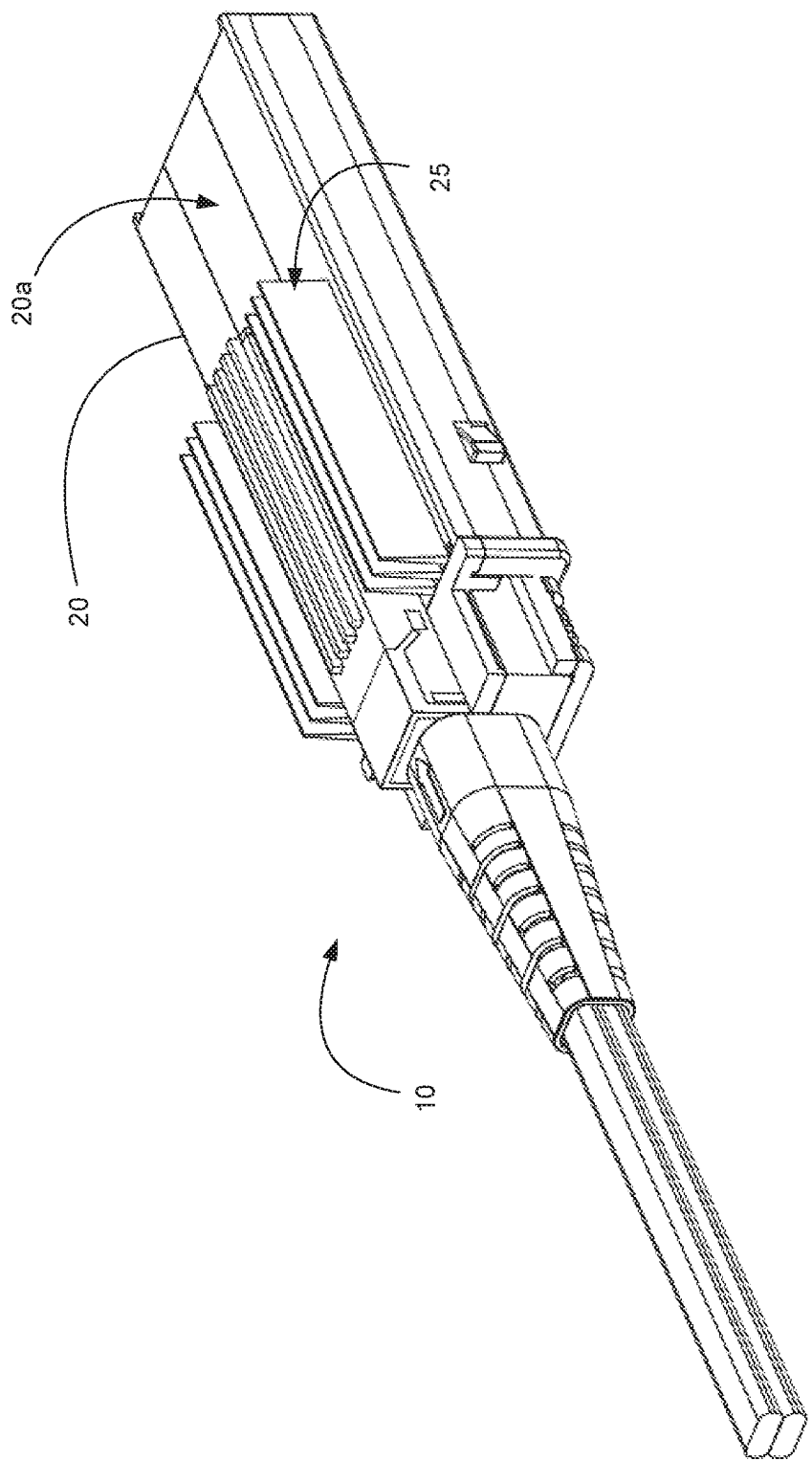
FIG. 10 illustrates a perspective view of an embodiment of a module.
Figure 11:
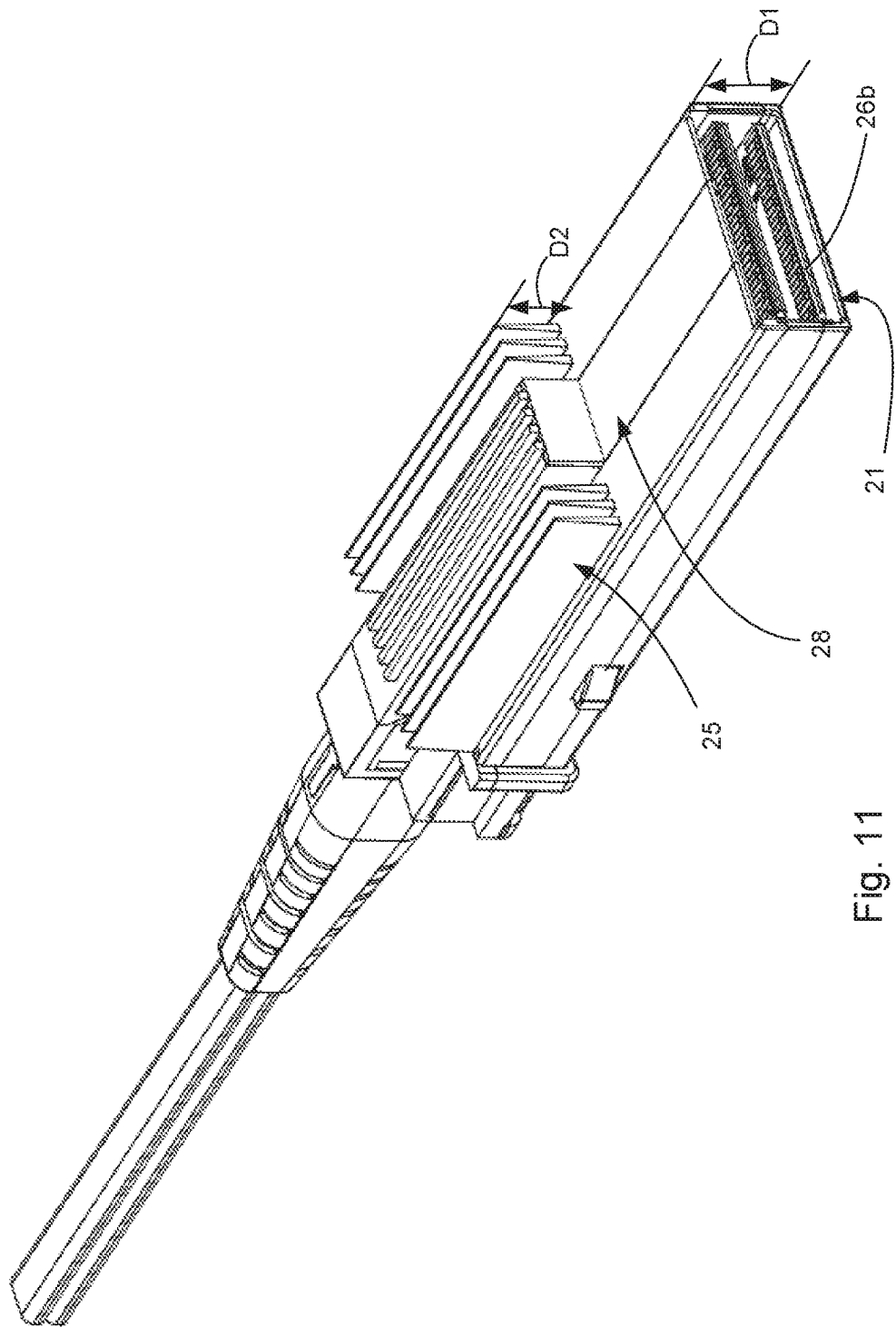
FIG. 11 illustrates another perspective view of the embodiment depicted in FIG. 10.
Figure 12:
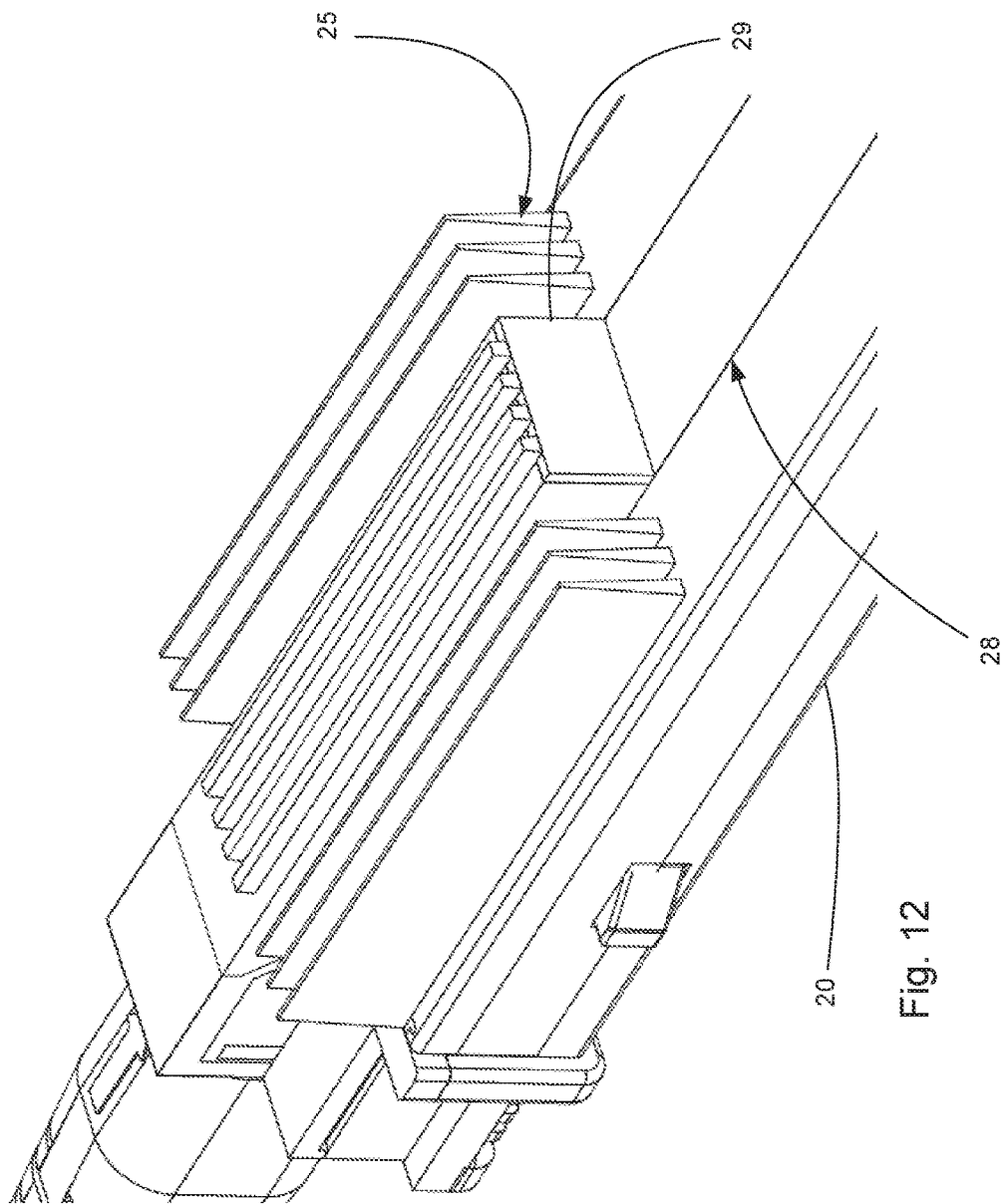
FIG. 12 illustrates an enlarged perspective view of the embodiment depicted in FIG. 11.

As can be appreciated, air flows in a port inlet 72, over the thermal surface (which can be fins, as depicted) and then out a vent wall 65. The set of apertures 67 in the vent wall 65 allow air to flow through the vent wall 65. Thus, air can pass through the inlet and out the vent wall, cooling the module in the process. To improve thermal performance it may be useful to increase the distance between a front face of the cage (e.g., where the inlet exists) and the vent wall 65 so that sufficient thermal transfer can take place. As can be appreciated from FIG. 8, the set of apertures 67 in the vent wall 65 can be configured so that they are aligned with the thermal surface 25 of the module 10.

The depicted receptacle 60 has the housing 90 aligned with and positioned adjacent the rear wall 64c. It has been determined that such a construction allows for sufficient spacing so as to provide the EMI barrier in the second portion 63 of the receptacle 60.

Figure 13:
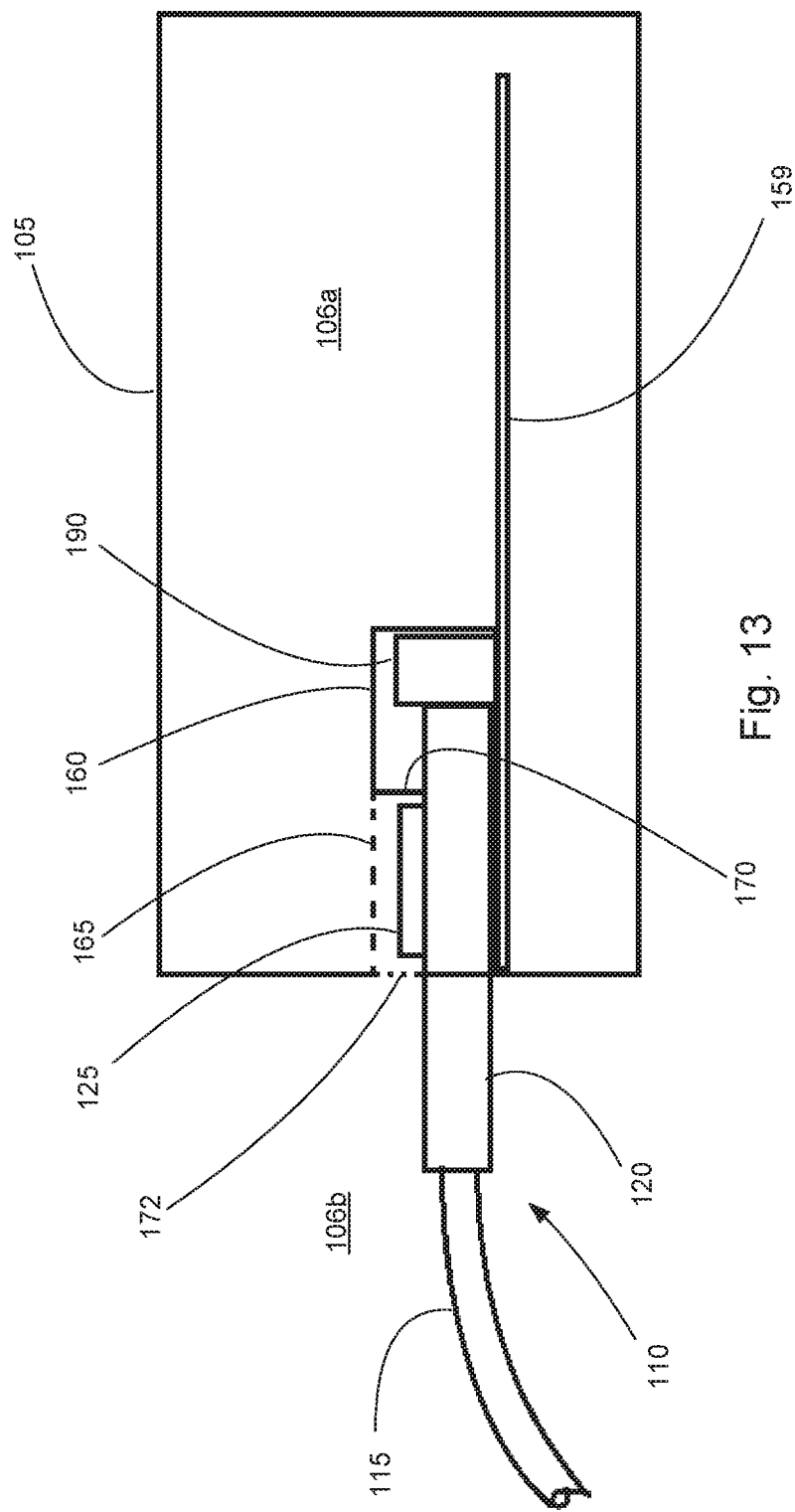
FIG. 13 illustrates a schematic representation of an exemplary connector system configured to provide cooling in a desirable manner.

FIG. 13 illustrates a schematic representation of a potential system. The system includes an enclosure 105 that define an interior space 106a and an exterior space 106b. As can be appreciated, a module 110, which can be partially positioned in the exterior space 106b is configured to be inserted into a receptacle 160, the receptacle providing a divider between the exterior space 106b and the interior space 106a. The module 110 includes a cable 115 that extends from the module 110 and can be configured to carry electrical or optical signals. It should be noted that the cable 115 may be configured to be removably connected to the module 110 or it can be permanently secured to the module, depending on the preference of the users.

The cage 160 includes an EMI barrier 170 that can be a combination of a wall and a gasket. Naturally, if the height of the cage 160 is sufficiently close to the height of the module 110 then the EMI barrier 170 can also be provided solely by a gasket, it being understood that the gasket can be a conventional EMI gasket made of spring fingers spaced apart at a desired position and in a cage with two or more portions (such as cage 60) this can be readily accomplished. A housing 190 is positioned in the cage 160 and is configured to mate to the module 110. For example, without limitation, the housing 190 could have one or more card slots and the module could have a mating ledge that is configured to mate with the terminals. The mating ledge could be provided by a paddle card or other desired structures.

The module 110 includes a thermal surface 125 that is thermally coupled to heat generating components provided in the module 110, preferably in a manner that provides low thermal resistance between the heat generating components and the thermal surface 125. The enclosure 105, which supports a circuit board 159 that in turn supports the housing 190 and the cage 160, is configured to create a pressure differential between its interior 206a and exterior 206b. The cage includes a port inlet 172 in communication with a vent wall 165 and due to the pressure differential, air flows between the interior 206a and exterior 206b. As can be appreciated, depending on the configuration, air will either flow from the interior 206a toward the exterior 206b or it will flow the other way.

Figure 4:
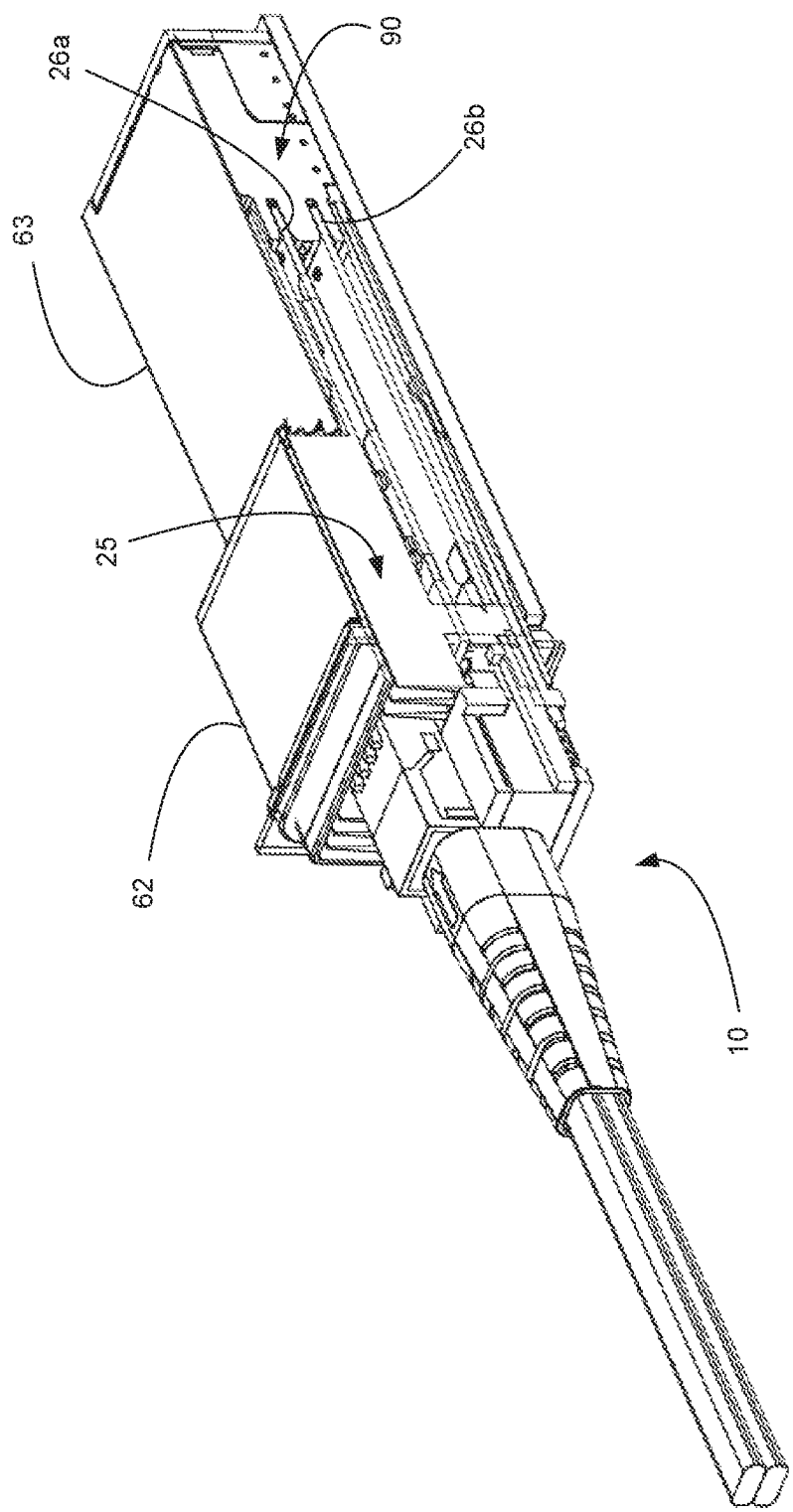
FIG. 4 illustrates a perspective view of a cross section of the embodiment depicted in FIG. 3.
Figure 5:
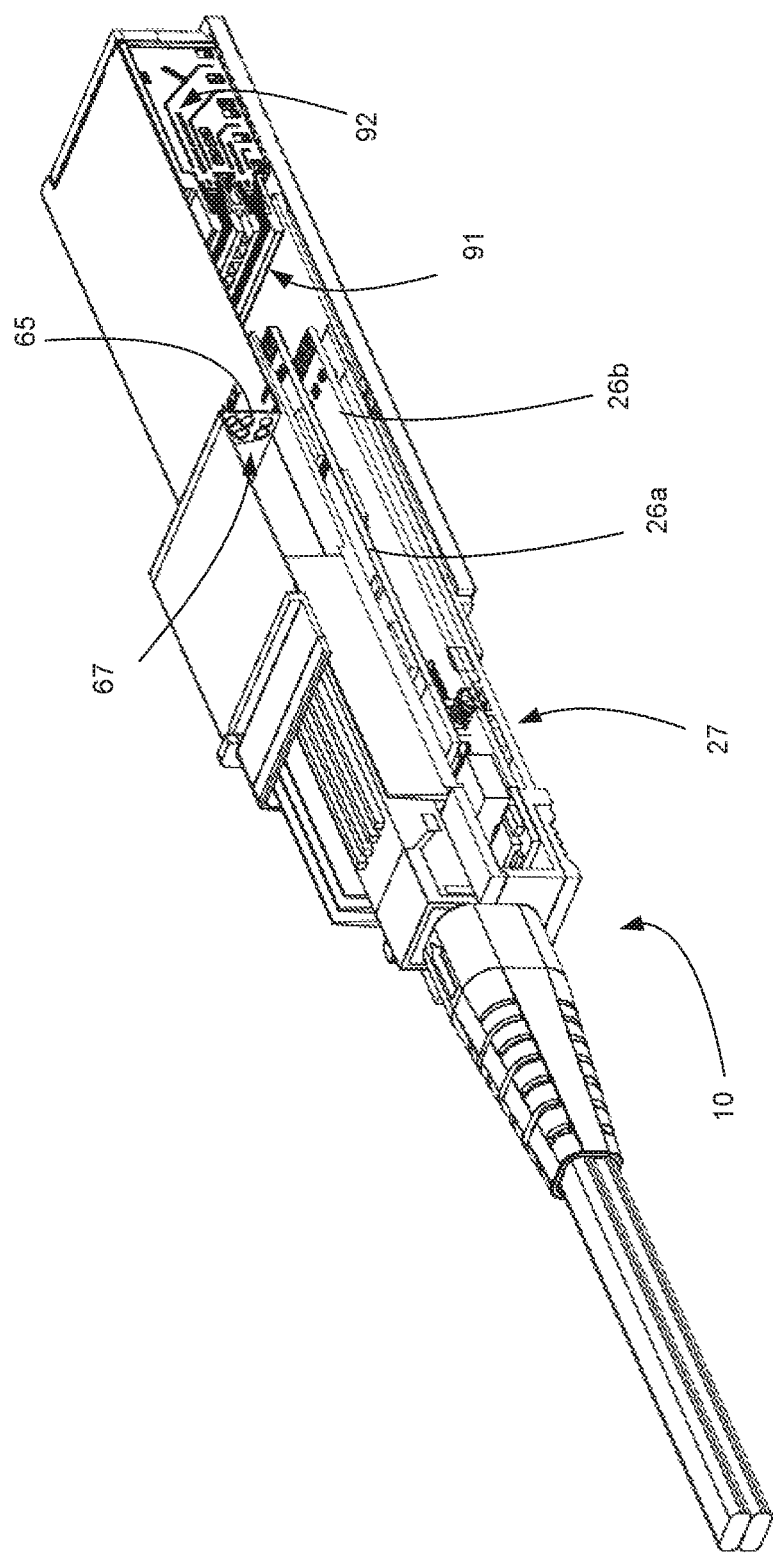
FIG. 5 illustrates a perspective view of a cross section of the embodiment depicted in FIG. 2.
Figure 6:
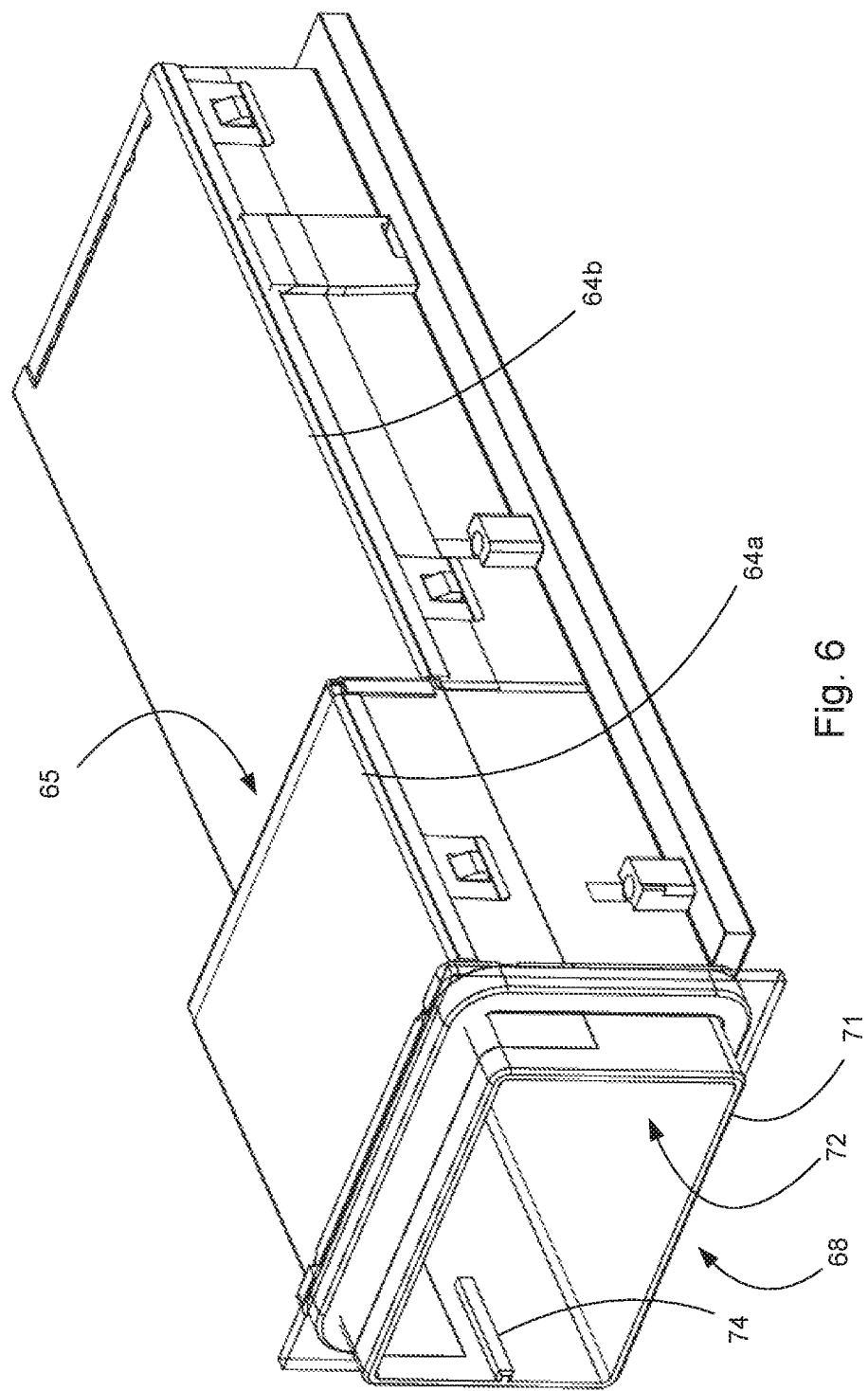
FIG. 6 illustrates a perspective view of an embodiment of a receptacle.
Figure 7:
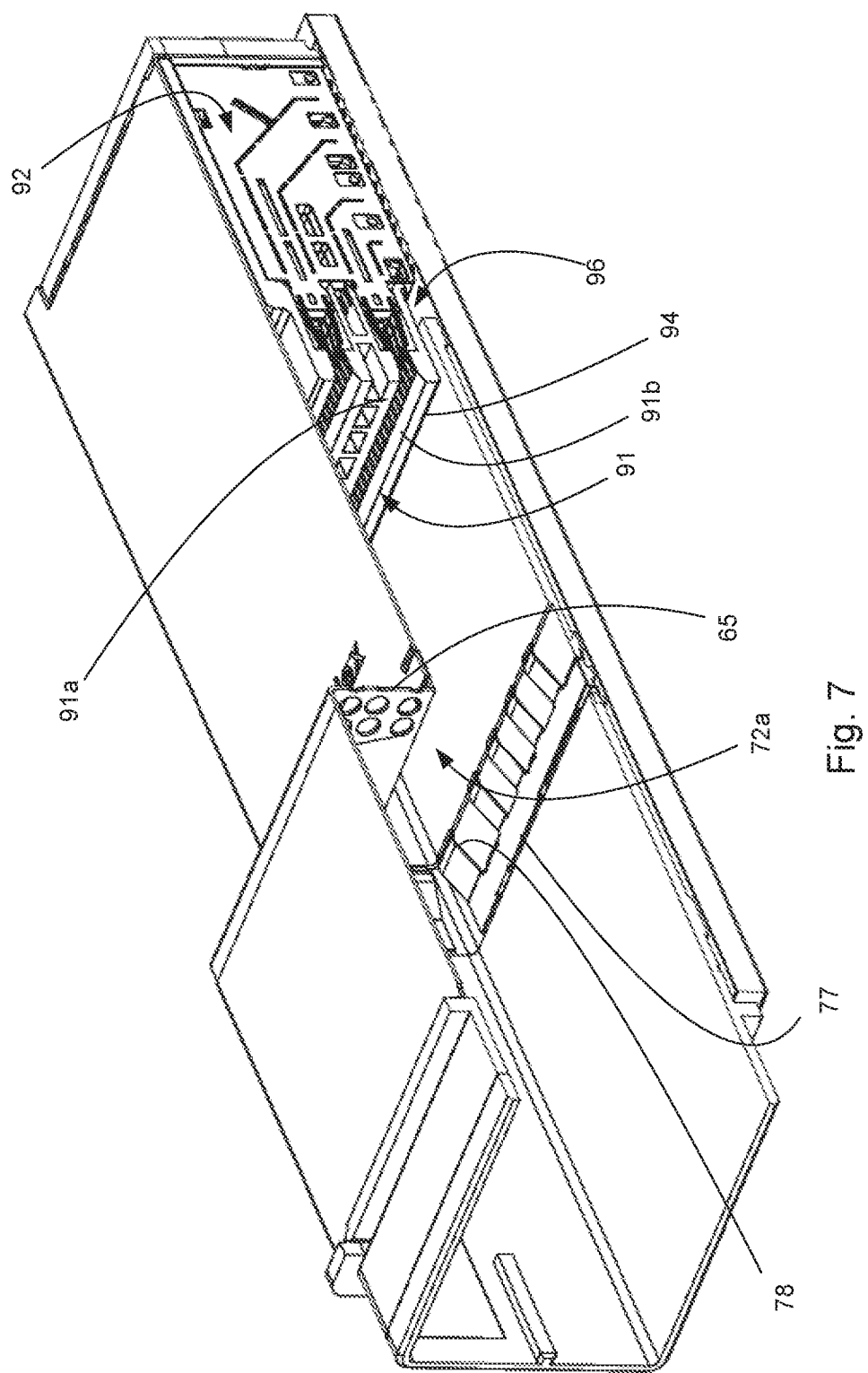
FIG. 7 illustrates a perspective view of a cross-section of the receptacle depicted in FIG. 6.

Regardless of the direction of the air flow, air will pass over the thermal surface 125. Because the air is cooler than the thermal surface 125, the air passing through the port inlet 172 cools the thermal surface 125 (either before or after passing through the port inlet 172). To help direct the air over the thermal transfer area, a vent wall 165 is provided. If desired, the vent wall 165 can be positioned so that air must pass by the thermal surface 125 when traveling between the port inlet 172 and the vent wall 165 (such as is depicted in FIG. 4, where the thermal surface 25 occupy a position between the port inlet 72 and the vent wall 65). It should be noted that the air inlet 172 can be entirely (or substantially) open to allow maximum air flow or it can be configured with openings sized to prevent EMI leakage. If the inlet is entirely open, then it is desirable to have apertures in the vent wall 165 that are sized to prevent the passage of EMI through the apertures and it is further desirable to have the cage extend between the vent wall 165 and the corresponding wall of the enclosure 205.

The disclosure provided herein describes features in terms of preferred and exemplary embodiments thereof. Numerous other embodiments, modifications and variations within the scope and spirit of the appended claims will occur to persons of ordinary skill in the art from a review of this disclosure.

I claim:

1. A receptacle connector, comprising:
   wafers with a card slot in a front face, the card slot having a first side and a second side, the wafers supporting a plurality of terminals, wherein some of the terminals are positioned on the first side and others of the terminals are positioned on the second side; and
   a cage defining a port, the cage having a front edge and a rear wall, the cage positioned around the wafers so that the wafers are adjacent the rear wall, the port extending from the front edge to the wafers, the port having a port inlet at the front edge having a first inner perimeter and a module inlet with a second inner perimeter adjacent the wafers, the port transitioning from the first inner perimeter to the second inner perimeter at a location between the front edge and the front face, the second inner perimeter being smaller than the first inner perimeter.

2. The receptacle connector of claim 1, wherein the port further includes an electromagnetic interference (EMI) gasket positioned in the module inlet, the EMI gasket configured, in operation, to engage a perimeter of an inserted plug connector so as to help reduce EMI.

3. The receptacle connector of claim 1, wherein the port includes a vent wall that extends between the first inner perimeter and the second inner perimeter, the vent wall being configured so as to allow air that flows in through the inlet to flow out through the vent wall.

4. The receptacle connector of claim 3, wherein the vent wall includes a plurality of apertures.

5. A connector system, comprising;
   wafers with a card slot in a front face, the card slot having a first side and a second side, the wafers supporting a plurality of terminals, wherein some of the terminals are positioned on the first side and others of the terminals are positioned on the second side;
   a cage defining a port, the cage having a front edge and a rear wall, the cage positioned around the wafers so that the wafers are is adjacent the rear wall, the port extending from the front edge to the wafers, the port having a port inlet at the front edge having a first inner perimeter and a module inlet with a second inner perimeter adjacent the wafers, the port transitioning from the first inner perimeter to the second inner perimeter at a location between the front edge and the front face, the second inner perimeter being smaller than the first inner perimeter; and
   a module including a body having a mating face, the body having a thermal surface on a first side, the module having a paddle card positioned in the body and extending from the thermal surface to a position adjacent the mating face and circuitry positioned in the body, the circuitry configured to emit at least 1 watt of thermal energy, the circuitry thermally connected to the thermal surface.

6. The receptacle connector of claim 5, wherein the port includes a vent wall that extends between the first inner perimeter and the second inner perimeter.

7. The receptacle connector of claim 6, wherein the vent wall includes a plurality of apertures.

8. A plug connector, comprising:
   a body having a mating face at a mating end, the body being elongated and extending in a first direction that is parallel with an insertion direction, the body having a thermal surface on a first side, the thermal surface having fins that extend along the first side toward the mating end;
   a paddle card positioned in the body and extending to a position adjacent the mating face; and
   circuitry positioned in the body, the circuitry configured to emit at least 1 watt of thermal energy, the circuitry thermally connected to the thermal surface, wherein the thermal surface includes at least 50% more surface area than a corresponding flat surface.

9. The connector of claim 8, wherein the paddle card is a first paddle card, the body further supporting a second paddle card.

10. The connector of claim 8, wherein the body has a height that is a first distance and the thermal surface extends above the first side a second distance that is at least half the first distance.

11. The connector of claim 8, wherein the body extends beyond a mating end of the paddle card at the mating end of the body.

* * * * *